United States Patent
Hammel et al.

(10) Patent No.: US 6,947,856 B2
(45) Date of Patent: Sep. 20, 2005

(54) METHOD AND DEVICE FOR DETECTING A SIGNAL

(75) Inventors: Christof Hammel, Stuttgart (DE); Juergen Biester, Boeblingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/074,182

(22) Filed: Feb. 12, 2002

(65) Prior Publication Data

US 2004/0212369 A1 Oct. 28, 2004

(30) Foreign Application Priority Data

Feb. 13, 2001 (DE) .......................................... 101 06 507
Oct. 10, 2001 (DE) .......................................... 101 50 050

(51) Int. Cl.$^7$ .............................................. G01R 19/00
(52) U.S. Cl. .............................. 702/64; 702/63; 702/65; 322/28

(58) Field of Search ...................... 702/63–65; 322/281, 322/99; 320/141, 142, 143, 145, 159, 160, 161, 162

(56) References Cited

U.S. PATENT DOCUMENTS 5,079,496 A * 1/1992 Pierret et al. .................. 322/28

* cited by examiner

*Primary Examiner*—Carol S. W. Tsai
(74) *Attorney, Agent, or Firm*—Kenyon & Kenyon

(57) ABSTRACT

Method for detecting a signal, particularly a voltage, for example a battery voltage, having the following steps:
- measuring the signal and/or the battery voltage at a predefined sampling rate,
- storing the measured measurement values in a buffer memory, and
- forming a median value of the stored measurement values in a time-slot pattern slower than the sampling rate to obtain an averaged value.

5 Claims, 2 Drawing Sheets

METHOD AND DEVICE FOR DETECTING A SIGNAL

FIELD OF THE INVENTION

The present invention relates to a method for detecting a signal, particularly a voltage, for example a battery voltage, as well as a corresponding device.

BACKGROUND INFORMATION

A need exists to provide detection of signals in the simplest and most reliable manner. Such signals are, for example, voltages which are to be detected, one example being battery voltage. Battery voltage is, for example, used in the course of determining a battery's state. However, other signals, for example sensor signals, must also be detected and subsequently analyzed in a simple and reliable manner.

It is possible to use low-pass filter circuits to determine smoothed voltage values. These types of circuits are considered relatively costly.

SUMMARY OF THE INVENTION

The method and devices according to the present invention have the advantage of providing a simple option for detecting a signal, particularly a voltage, for example a battery voltage. Detection of a signal or a battery voltage with maximum noise and/or interference suppression is provided with very low phase loss and minimum cost for hardware and software according to the present invention.

The averaged voltages obtained according to the present invention are expediently subjected to a phase compensation. With a phase compensation of this type, a phase rotation of the averaged signal which is perceived to be too large may be compensated in a simple way.

According to a preferred phase compensation, a compensation algorithm of the form $$y(k)=x(k)+\frac{1}{2}*[x(k)-x(k-1)]$$

is used, x(k) being the averaged voltage, for example the battery voltage to be detected at an instant k, and x(k−1) being the averaged voltage at an instant k−1.

DETAILED DESCRIPTION

First, the concept "median" used in the framework of the present invention will be explained. The median is the number which lies in the middle of a series of numbers. This means that one half of the numbers have values which are smaller than the median, and the other half have values which are larger than the median. If a series of numbers has an even number of numbers, the median value refers to the average value of the two middle numbers. For example, a median value of 3 thus results for the series of numbers 1, 2, 3, 4, 5, and for the series of numbers 1, 2, 3, 4, 5, 6, a median value of 3.5 results. It should be noted that the concept of "median" used is also to include other customary definitions of the concept.

Figure 1:
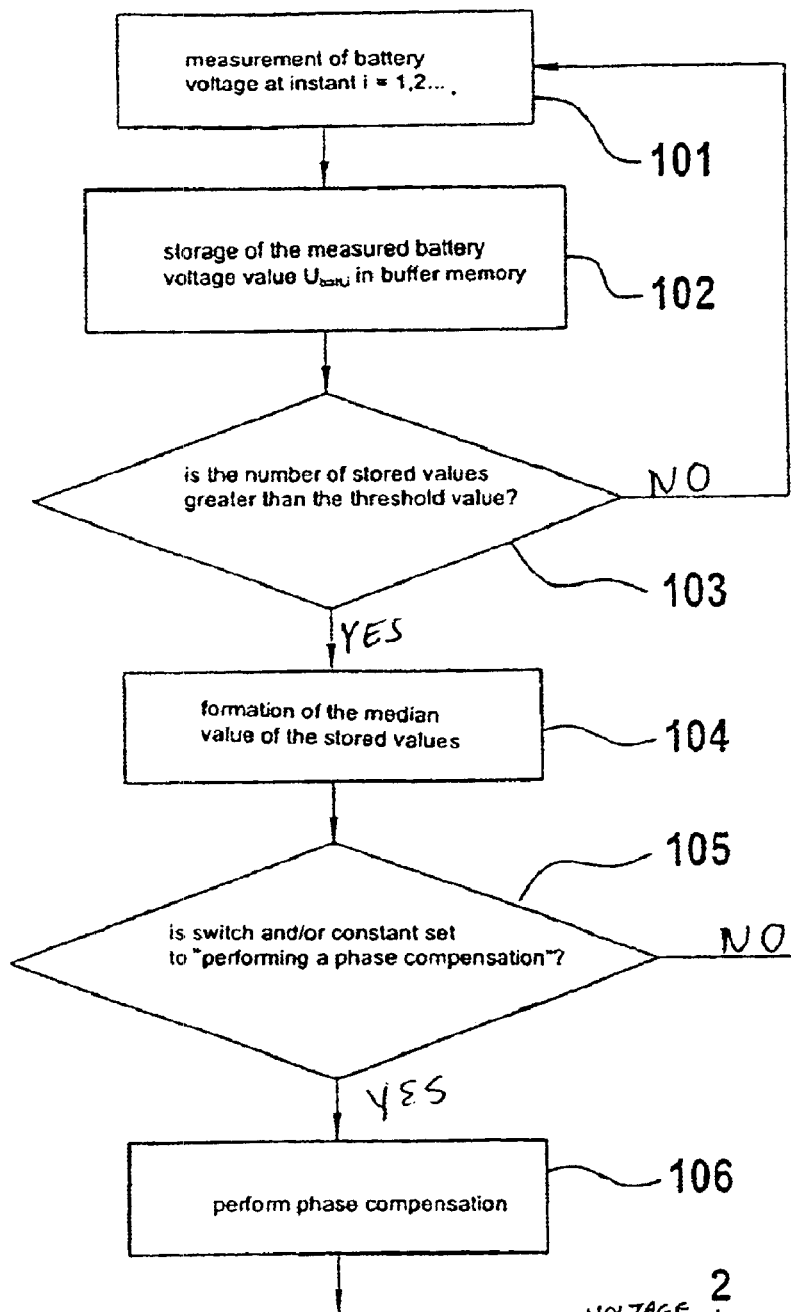
FIG. 1 shows a flow diagram to illustrate a preferred embodiment of the method according to the present invention.

A preferred embodiment of the method according to the present invention will now be described with reference to FIG. 1.

In a step 101, a measurement of a battery voltage occurs at an instant i=1.

In a step 102, the battery voltage value at instant i=1, $U_{batt,i=1}$, is stored in a buffer memory.

In a step 103, it is checked whether or not the number of values stored in the buffer memory is smaller than a threshold value. If the number is smaller than the threshold value, the method branches back to step 101, in which a new battery voltage measurement is performed at an instant i=2. The sampling rate, i.e., the time-slot pattern between two steps 101, is, for example, 1 ms.

If it is established in step 103 that the number of stored battery voltage values has reached the threshold value, in a subsequent step 104 the median value of the stored measurement values is determined to obtain a battery voltage average value.

In a subsequent step 105, it is decided, depending on an applicatively adjustable switch setting and/or constant, whether the signal should additionally be phase compensated. This is expedient if a step width k is selected to be relatively large, and high demands are placed on the phase angle. This optional phase compensation may, for example, be applicatively adjusted via a software switch, so that it may be performed every time or not at all during the performance of the method. It is conceivable in this connection to preset the setting of the switch on the program side, i.e., to provide no switch and/or to allow no applicative adjustment of the switch. Reference is made to the following embodiments further below in regard to the definition of step width k.

If it is established in step 105 that the constant is set to "performing a phase compensation", particularly by the software switch, a compensation algorithm is performed in a step 106, a signal compensated in this way subsequently being output and relayed to the computing and/or processing devices mentioned. A compensation algorithm used in step 106 may, for example, have a form according to the equation $$y(k)=x(k)+\frac{1}{2}*[x(k)-x(k-1)],$$

x(k) representing the median value at an instant k, and x(k−1) representing the median value at an instant k−1. y(k) thus represents the compensated median value at instant k. It should be noted that the instants k describe a coarser time-slot pattern than the instants i, so that, for example, during the formation of a median value on the basis of measurements at approximately 10 instants i, one instant k is defined, and a further instant k+1 is defined after median formation on the basis of the approximately 10 subsequent instants i.

Figure 2:
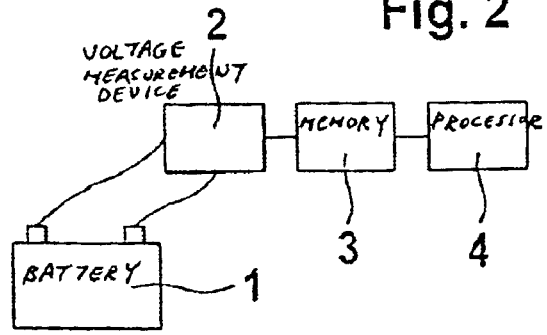
FIG. 2 shows a block diagram to illustrate a preferred embodiment of the device according to the present invention.

In FIG. 2, a preferred embodiment of a device for performing the method according to the present invention is illustrated. A battery indicated as a whole with 1, whose plus and/or minus poles are connected with a voltage measurement device 2, is recognizable here. Voltage measurement device 2 measures the voltage values of the battery with a high sampling rate, for example in the range of one millisecond, and relays the values to a memory device 3, in which the measurement values are stored. If a sufficient number of measurement values (e.g., 10) has been stored in the memory, they are supplied to a computing device 4, in which a median is formed in the way described above. Computing device 4 is connected in a way known per se with further control devices and/or computing devices, which are not shown here for the sake of simplicity. It is possible to implement memory device 3 and computing device 4 as integrated in the form of a controller. Memory device 3 may particularly be implemented as a ring memory.

Figure 3:
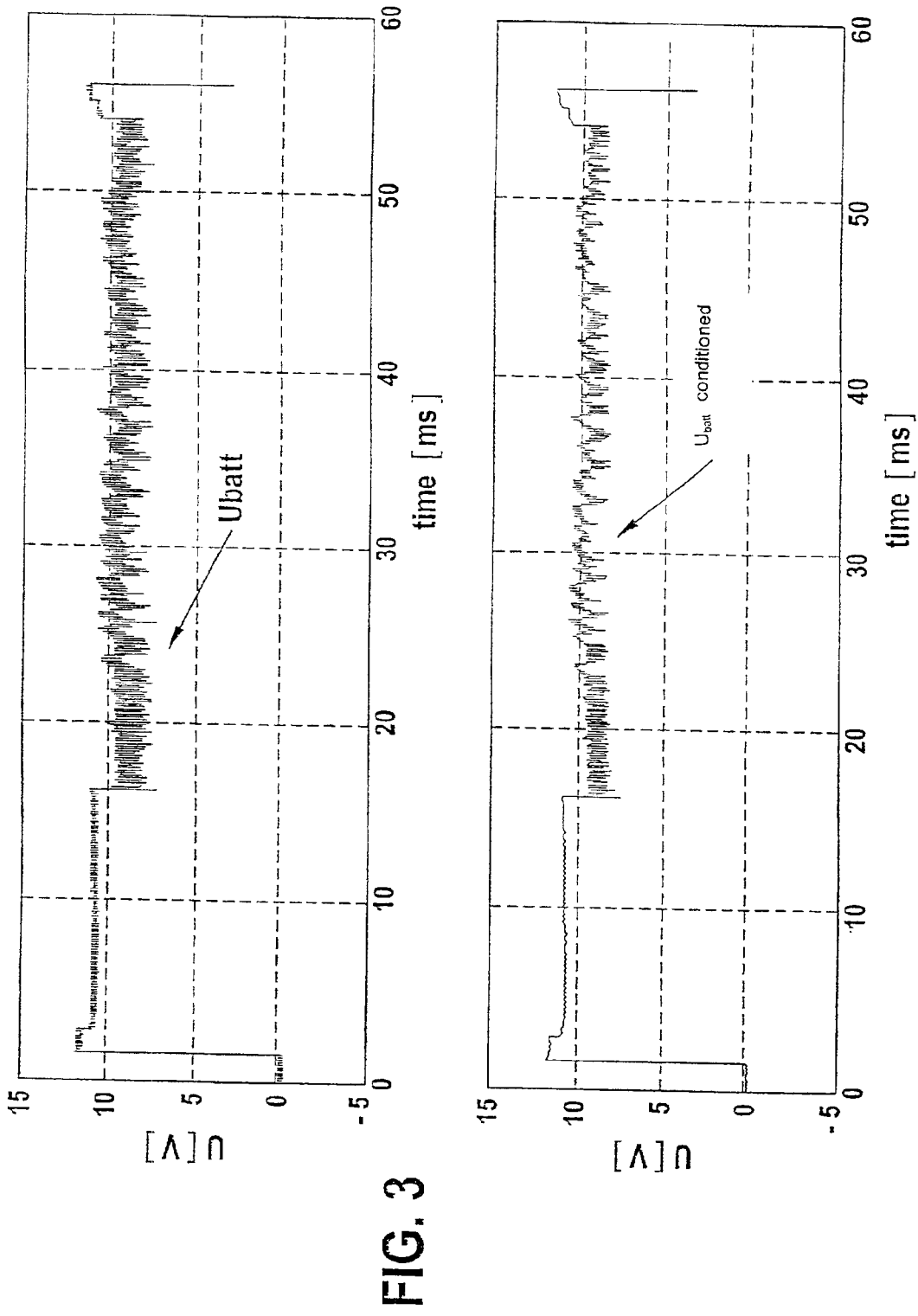
FIG. 3 shows a diagram for comparison of battery voltage measurements with and without the use of the method according to the present invention.

In the upper part of FIG. 3, the measured battery voltage without using the method according to the present invention is illustrated relative to time. A relatively high noise level of the measured battery voltage $U_{batt}$ is recognizable.

In the lower part of FIG. 3, in contrast, the battery voltage after conditioning using the method according to the present invention is illustrated relative to time. It is recognizable that by using the method according to the present invention, noise may be effectively reduced and/or suppressed.

The present invention is illustrated for the example of detection of a battery voltage, but it may be used for any desired voltage detection and may in principle even be used for signal detection in general, with, for example, the signals S which are to be detected being supplied by a sensor.

What is claimed is:

1. A method for detecting and reducing noise in a battery voltage signal comprising:

measuring the battery voltage signal at a predefined sampling rate to provide measured values;

storing the measured values in a buffer memory;

checking whether a number of the measured values stored in the buffer memory has reached a threshold value;

forming a median value of the stored measured values in a time-slot pattern slower than the sampling rate if the number of values stored in the buffer memory has reached the threshold value; and compensating for noise in the measured values using the median value.

2. The method according to claim 1, further comprising phase compensating the median value.

3. The method according to claim 2, wherein the phase compensation includes a compensation algorithm of the form:

$$y(k)=x(k)+\tfrac{1}{2}*[x(k)-x(k-1)],$$

x(k) being a battery voltage value at an instant k averaged by forming a median, x(k−1) being a battery voltage value at an instant k−1 averaged by forming a median, and y(k) being a compensated averaged battery voltage value at the instant k.

4. A device for detecting and reducing noise in a battery voltage signal comprising:

means for measuring the battery voltage signal of a predefined sampling rate to provide measured signal values;

means for storing the measured signal values;

means for checking whether a number of the measured values stored in the means for storing has reached a threshold value; and means for forming a median value of the stored measured signal values in a time-slot pattern slower than the sampling rate if the number of values stored in the buffer memory has reached the threshold value.

5. The device according to claim 4, wherein the means for storing includes a ring memory.

* * * * *